United States Patent [19]

Kurata et al.

[11] Patent Number: 5,367,613
[45] Date of Patent: Nov. 22, 1994

[54] ABSTRACT PATTERN PLATE MAKING SYSTEM AND PRINTED MATTER PRINTED THEREBY

[75] Inventors: Michio Kurata; Toshio Modegi, both of Tokyo; Eisuke Arai, Urawa, all of Japan

[73] Assignee: Dai Nippon Printing Co., Ltd., Tokyo, Japan

[21] Appl. No.: 229,101

[22] Filed: Apr. 18, 1994

Related U.S. Application Data

[63] Continuation of Ser. No. 950,320, Sep. 24, 1992, abandoned.

[30] Foreign Application Priority Data

Sep. 26, 1991 [JP] Japan .................................. 3-247584

[51] Int. Cl.$^5$ .............................................. G06F 15/00
[52] U.S. Cl. ........................................ 395/109; 358/454
[58] Field of Search ........ 395/108, 109, 117, 129–132; 358/454, 456, 533, 534, 535, 536; 345/114, 28; 346/154, 157

[56] References Cited

U.S. PATENT DOCUMENTS 4,916,545  4/1990  Granger ................................ 358/78
5,175,804  12/1992  Wittmann ............................ 395/109

FOREIGN PATENT DOCUMENTS

0489582A2  6/1992  European Pat. Off. .

Primary Examiner—Arthur G. Evans
Attorney, Agent, or Firm—Oliff & Berridge

[57] ABSTRACT

An abstract pattern plate making system comprising a grain pattern generator for generating grain patterns free of unintended repetitive patterns. When an image size, a grain count, maximum displacement amounts and a grain shape are input, the grain pattern generator generates the basic addresses of the designated number of grains in such a manner that the grains occur at equal and uniform intervals in the designated image size and that the number of grains per unit area remains constant. The address of each grain is then displaced relative to its basic address with the designated maximum amounts of displacement. The designated grain shape is assigned to each of the displaced addresses so as to generate a grain pattern. If the address of any grain protrudes out of the designated image size, the grain pattern generator transfers the protruding pixel to a location opposite to the protruding side so as to keep the grain within the designated size.

4 Claims, 4 Drawing Sheets

ABSTRACT PATTERN PLATE MAKING SYSTEM AND PRINTED MATTER PRINTED THEREBY

This is a continuation of application Ser. No. 07/950,320 filed Sep. 24, 1992, now abandoned.

BACKGROUND OF THE INVENTION

1. Field of the Invention

The present invention relates to a plate making system for printing abstract patterns and especially sand patterns on construction materials, and to printed matter printed by use of plates made by that plate making system.

2. Description of the Prior Art

Today, there is a growing awareness that natural construction materials such as timber are getting scarce. To meet the demand for such materials, alternative materials such as plywood and gypsum board have been developed. The surface of these artificial materials is usually decorated with printed matter. The importance of such printed matter is growing in terms of both decorative and protective roles it plays.

Patterns of the printed matter on construction materials fall into two major groups: a natural pattern group comprising such naturally occurring patterns as wood and stone texture patterns, and an artificially created abstract pattern group including geometric patterns, ground tint patterns, floral patterns and so called sand grain patterns. Sand grain patterns refer to that kind of pattern and its modifications which is obtained by conceptually sprinkling numerous sand grains over a monotone surface of paper or like material.

Sand grain patterns are printed on construction materials conventionally by one of three methods. For any of these methods, a sand grain pattern is created first, followed by the making of a plate based on that pattern.

The first prior art method involves collecting sand grains, sprinkling them over a monotone paper surface of the like to create a sand grain pattern, photographing the pattern, and manually making a plate of the pattern by photo-etching. The second prior art method involves having a scanner read from a film of the photo image created by the first method and making a plate of the image by electronic gravure-engraving. The third prior art method involves electronically generating sand grain patterns. More specifically, a given number of sand grains are randomly generated and arranged in an image memory using a random number. The pattern thus generated is made into a plate by electronic gravure-engraving.

With sand grain patterns as well as other abstract patterns, some unforeseen pattern deviation may emerge and become visible at the proof printing stage or running-on stage. In such a case, a repetitive pattern unintended by the designer or pattern creator appears, sometimes more pronounced than the original pattern. This is a major problem with the three prior art methods when any of them is used to create sand grain patterns.

The unintended repetitive pattern, if it occurs, is a fatal flaw of construction materials with printed abstract patterns. Checks are carried out to make sure that such patterns do not occur throughout the process up to the running-on stage. Should any unintended repetitive pattern be recognized, it is removed by the operation generally known as retouching. Retouching is a wholly manual process that requires a great deal of experience and expertise. The process is subject to heavy work load, is time-consuming, and not always effective in completely eliminating latent undesirable patterns. In particular, because the sand grain pattern is a collection of dots that are minuscule binary images, removing one unintended repetitive pattern often gives rise to another such pattern. Completely removing those undesirable repetitive patterns is a difficult task to achieve.

The third prior art method mentioned above has an additional problem to contend with. If the accuracy of random number generation is relatively low or if the number of grains or used random numbers is very large despite a high level of accuracy in generating the random number, unintended repetitive patterns are more liable to occur.

SUMMARY OF THE INVENTION

It is therefore an object of the present invention to overcome the above-described drawbacks and disadvantages of the prior art and to provide an abstract pattern plate making system capable of generating sand grain patterns free of unintended repetitive patterns therein.

Another object of the invention is to provide printed matter printed by use of any pattern generated by the abstract pattern plate making system according to the invention.

In carrying out the invention and according to one aspect thereof, there is provided an abstract pattern plate making system comprising: pattern generating means for assigning a predetermined number of points in a predetermined memory space in such a manner that the points occur at equal and uniform intervals and that the number of points per unit area remains constant; for randomly displacing the address of each of the points within a predetermined maximum range of displacement: and for allocating a predetermined pattern to the displaced address of each of the points in order to generate an abstract pattern.

According to another aspect of the invention, there is provided a printed matter printed with a plate created by following the steps of: assigning a predetermined number of points in a predetermined memory space in such a manner that the points occur at equal and uniform intervals and that the number of points per unit area remains constant; randomly displacing the address of each of the points within a predetermined maximum range of displacement; allocating a predetermined pattern to the displaced address of each of the points in order to generate an abstract pattern; repeating the generated abstract pattern in longitudinal and traverse directions a predetermined number of times to generate a final pattern; and creating the plate based on the final pattern.

As mentioned, the abstract pattern plate making system according to the invention comprises the pattern generating means for generating an abstract pattern made of one of a plurality of dots in combination. Initially, the pattern generating means assigns a predetermined number of points in a predetermined memory space in such a manner that the points occur at equal and uniform intervals and that the number of points per unit area remains constant. The pattern generating means then randomly displaces the address of each of the points within a predetermined maximum range of displacement. A predetermined pattern is allocated to the displaced address of each of the points in order to generate an abstract pattern.

More specifically, the pattern generating means assigns the multiple points to a state free of unintended repetitive patterns. From that state, each point is randomly displaced. That is, each point is vibrated around its initial position within the maximum allowable range of displacement. With the abstract pattern thus generated, there is no possibility of localized pattern concentration or dispersion occurring therein. In this manner, it is possible theoretically to generate abstract patterns free of unintended repetitive patterns.

One benefit of the invention is that it eliminates the chore Of removing unintended repetitive patterns or of editing the generated pattern from the pattern generating process. Bringing the generated pattern direct to the running-on stage substantially alleviates the work load on pattern generation.

Another benefit of the invention concerns randomizing. Because the randomizing function is used only to displace the address of each point from its basic address, the accuracy of that function need not be very high.

Furthermore, if the displaced address of each point (i.e., pixel) falls out of the predetermined pixel area, that address is transferred to the opposite side of the area to enable generation of an endless abstract pattern.

These and other objects, features and advantages of the invention will become more apparent from a consideration of the following description and appended drawings.

BRIEF DESCRIPTION OF THE DRAWINGS

The preferred embodiment will be described with reference to the drawings, wherein like elements have been denoted throughout the figures with like reference numerals, and wherein.

DESCRIPTION OF THE PREFERRED EMBODIMENT

The preferred embodiment of the invention will now be described with reference to the accompanying drawings.

Figure 1:
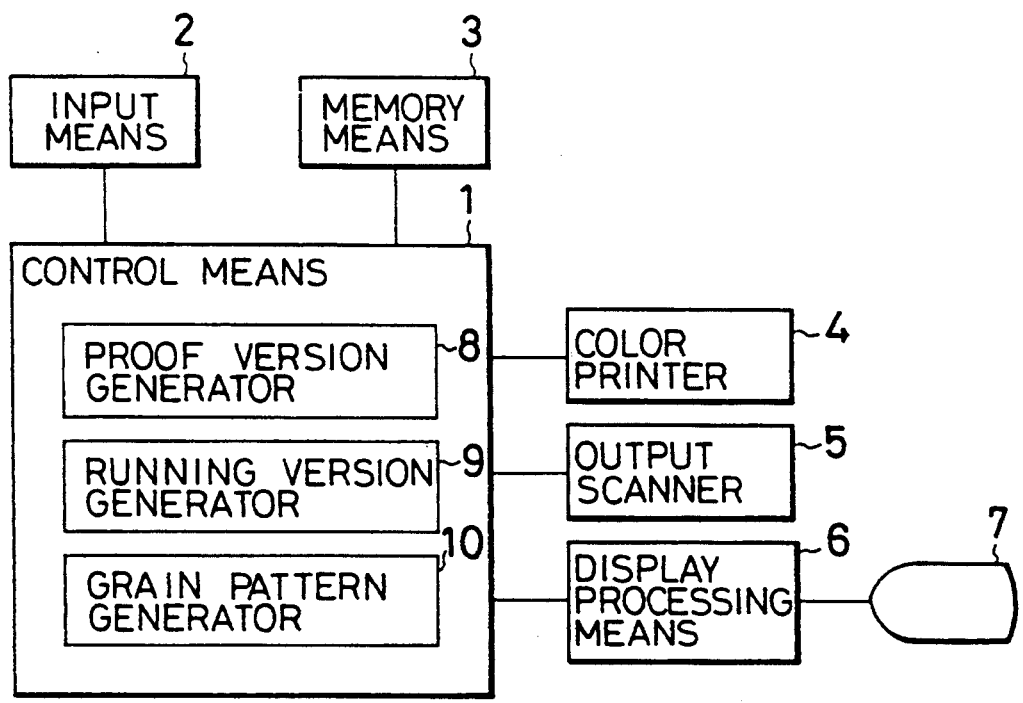
FIG. 1 is a view showing a typical constitution of the preferred embodiment of the invention.

FIG. 1 is a view showing the constitution of an abstract pattern plate making system practiced as the preferred embodiment of the invention. In FIG. 1, reference numeral is control means; 2 is input means; 3 is memory means; 4 is a color printer; 5 is an output scanner; 6 is display processing means; 7 is a color monitor; 8 is a proof version generator; 9 is a running version generator; and 10 is a grain pattern generator.

Referring to FIG. 1, the control means 1 comprises a central processing unit (CPU) and its peripheral circuits, and provides comprehensive control over the operation of the abstract pattern plate making system as a whole. The proof version generator 8, running version generator 9 and grain pattern generator 10 are included in the control means. The operational aspect of the generators 8, 9 and 10 will be described later.

The input means 2 is constituted by such input devices as a keyboard and a pointing device.

Figure 2:
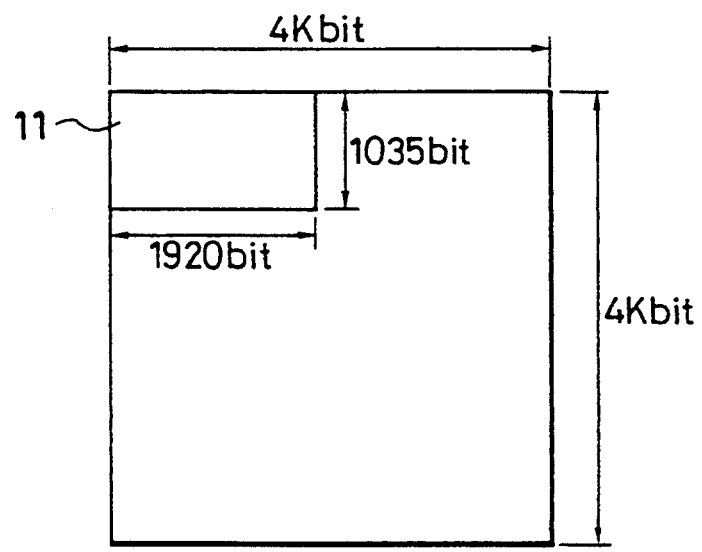
FIG. 2 is a view depicting a typical structure of a work memory for use with the embodiment.

The memory means 3, illustratively made of a ROM, RAM ever a hard disk unit, comprises at least eight RAMs 4 kilobits by 4 kilobits each in capacity as a work area for the control means 1, with one pixel assigned to one byte, as depicted in FIG. 2.

The color printer 4 may be a sublimation transfer color printer, an ink jet color printer or the like. The printer should be capable of outputting at least color hard copy of the proof version size and preferably that of the running version size. In this embodiment, the printer of the latter type is used.

The output scanner 5 outputs separated color planes or plates of C, M, Y and K onto films. The constitution of the output scanner 5 is similar to that of conventional layout scanners. The film thus prepared by the scanner is brought to a gravure engraving machine to make a gravure plate cylinder. The plate cylinder is set on a gravure printing press for proof sheet printing or running-on printing.

The display processing means 6 controls the color monitor 7 in terms of display. The means 6 has a video RAM whose capacity accommodates the number of pixels on the color monitor 7. From the work area of the memory means 3, the image data to be displayed are transferred to this video RAM.

The color monitor 7 is constructed with a color CRT, preferably the kind of color CRT which permits high-resolution image display. Although it is desirable to display as many pixels as possible, the state of the art today has yet to offer a monitor that would represent at once all of the pixels of 4 kilobits by 4 kilobits shown in FIG. 2. Instead, as pointed to by numeral 11 in FIG. 2, the image data in a part of the work area may be transferred to the video RAM of the display processing means 6 for display. That part of the work area, called a display area, may illustratively comprise 1035 pixels in the longitudinal direction (Y direction) by 1920 pixels in the traverse direction (X direction).

How the embodiment of FIG. 1 generates and prints a sand grain pattern will now be described with reference to FIG. 3.

An operator first selects a grain pattern generation menu using the input means 2. The control means 1 detects the operation and activates the grain pattern generator 10 accordingly. This causes the color monitor 7 to display a screen that prompts the operator to input an image size. The input of the image size is the operation that sets that part of the work area in which to generate a grain pattern. Although the whole work area of FIG. 2 could be designated, this embodiment initially limits itself to generating a grain pattern in the display area 11 inside the work area. The grain pattern is displayed on the color monitor 7 or printed as hard copy by the color printer 4 for verification. If everything checks out on the output pattern, the grain pattern of the whole work area is generated.

Therefore, first in step S1, the operator designates 1035 pixels for the longitudinal size ($SIZ_X$) and 1920 pixels for the traverse size ($SIZ_Y$) in response to the image size input prompt.

On detecting the image size input, the grain pattern generator 10 goes to step S2. In step S2, both the work area and a random number generator are initialized. To the whole area of the work area, value $\phi$ is written and the root value of a random number generator is set to a certain odd number.

With the work area and the random number generator initialized, the grain pattern generator 10 enters step S3. In step S3, the grain pattern generator 10 prompts the operator to input the following parameters: the number of sand grains $N_X$ to be arranged in the traverse direction; the number of sand grains $N_Y$ to be arranged in the longitudinal direction; the maximum amount of traverse displacement $MAXD_X$ in which to displace the sand grain; the maximum amount of longitudinal displacement $MAXD_Y$ in which to displace the sand grain; and dot shape parameters $DOT_X$ and $DOT_Y$ for designating the shape of the sand grains in the traverse and longitudinal directions being located at their positions after their positions have been determined.

The input of the grain shape is carried out specifically as follows: The grain pattern generator 10 illustratively has a one-dot pattern, a two-dot pattern and a four-dot pattern as stored grain shapes, shown in FIGS. 4A, 4B and 4C. One of these shapes is selected by the operator.

Figure 4A:
FIGS. 4A, 4B and 4C are a set of views illustrating typical grain shapes for use with the embodiment.

The parameters $DOT_X$ and $DOT_Y$ indicate that one sand grain is made of $DOT_X$ pixels (dots in traverse direction) by $DOT_Y$ pixels (dots in longitudinal direction). The shape of FIG. 4A is designated by $DOT_X=1$, $DOT_Y=1$; that of FIG. 4B by $DOT_X=2$, $DOT_Y=1$; and that of FIG. 4C by $DOT_X=2$, $DOT_Y=2$. Although the shape of FIG. 4B constitutes a pattern similar to the one designated by $DOT_X=2$, $DOT_Y=2$ in FIG. 4C, they are not the same shape as depicted in the two figures and are distinguished by assigning $DOT_X=2$, $DOT_Y=1$ to the shape of FIG. 4B.

The maximum amounts of displacement $MAXD_X$ and $MAXD_Y$ may each be designated using either a pixel count or an address. The dot size of the grain shape may be fixed or varied as desired in both the longitudinal and the traverse directions.

After the inputs of the grain counts, maximum displacement amounts and grain shape in step S3 are made and detected, the grain pattern generator 10 goes to step S4. In step S4, the grain pattern generator 10 first performs the operations of expression (1) and (2) below to find a traverse pitch $PIT_X$ and a longitudinal pitch $PIT_Y$, and then performs the operations of expressions (3) and (4) that follow to generate the basic address ($X_b$, $Y_b$) of each sand grain at a location (i, j):

$$PIT_X = SIZ_X/N_X \quad (1)$$

$$PIT_Y = SIZ_Y/N_Y \quad (2)$$

$$X_b = PIT_X * i - PIT_X/2 * (j \% 2) \quad (3)$$

$$Y_b = PIT_Y * j \quad (4)$$

where, the symbol * indicates a multiply operation, and (j % 2) means the remainder from dividing j by 2.

Figure 5:
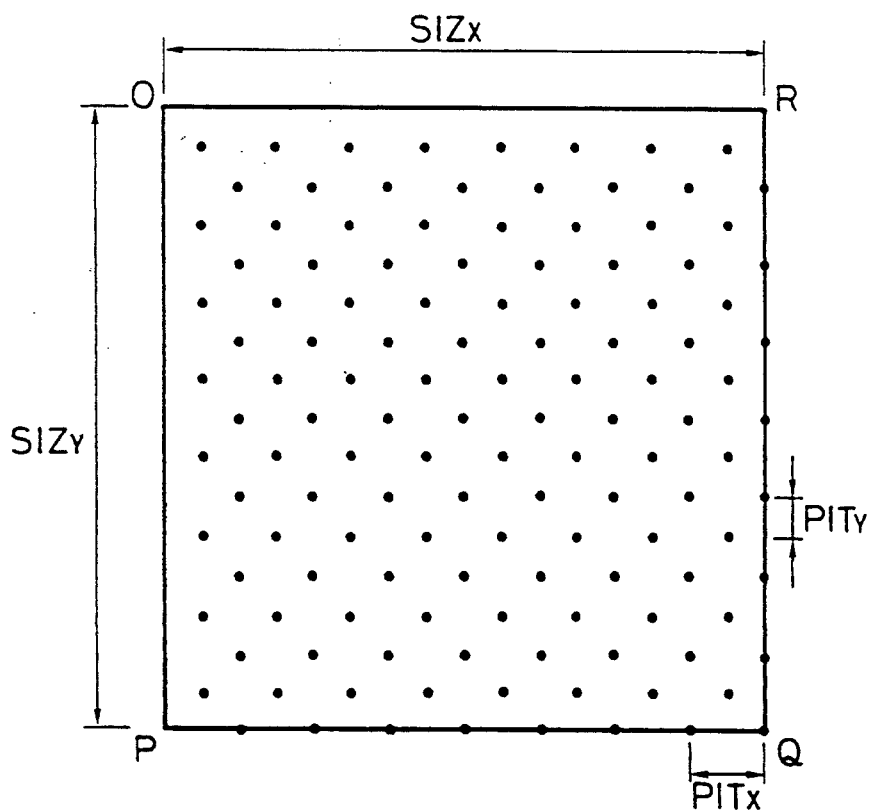
FIG. 5 is a view for explaining basic addresses in connection with the invention.

FIG. 5 is a view of basic addresses generated in the manner described. In FIG. 5, each black point indicates the address of each sand grain. In this example, $N_X=8$, $N_Y=16$, and $PIT_Y$ is half of $PIT_X$ so that the address in the X direction is displaced by $PIT_X/2$ per line. Although it is not an indispensable condition for the embodiment to establish, as shown in FIG. 5, that $PIT_Y=PIT_X/2$ and that the x-direction address is displaced by $PIT_X/2$ per line, it is important to arrange the grains at equal and uniform intervals when their addresses are generated. Thus the grain addresses are generated so that the grain count per unit area stays constant. These are basic addresses, and no unintended repetitive pattern OCCURS at the stage of basic address generation. In FIG. 5, origin 0 has an address (1, 1); point P, (1, $SIZ_Y$); point Q, ($SIZ_X$, $SIZ_Y$); and point R, ($SIZ_X$, 1).

With the processing of basic address generation completed, the grain pattern generator 10 goes to step S5. In step S5, the grain pattern generator 10 performs the operations of expressions (5) and (6) below to generate an address ($D_X$, $D_Y$) for displacing the basic address of each sand grain:

$$D_X = MAXD_X * (RND - 0.5) \quad (5)$$

$$D_Y = MAXD_Y * (RND - 0.5) \quad (6)$$

where, RND is a function for generating random numbers between 0 and 1 exclusive. The value of the function RND varies every time that function is called.

After generating the displacement address for every grain having a basic address, the grain pattern generator 10 goes to step S6. In step S6, the grain pattern generator 10 performs the operations of expressions (7) and (8) below to calculate the addresses of the pixels in the designated grain shape. That is, where the grain shape of $DOT_X \times DOT_Y$ pixels (dots) is designated, the address of the dot at a location (k, l) ($1 \leq k \leq DOT_X$, $1 \leq l \leq DOT_Y$) in the designated grain shape is calculated using the expressions:

$$X(k, l) = X_b + D_X + k - 1 \quad (7)$$

$$Y(k, l) = Y_b + D_Y + l - 1 \quad (8)$$

Figure 4B:
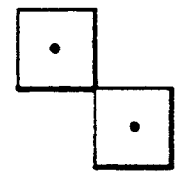
Figure 4C:
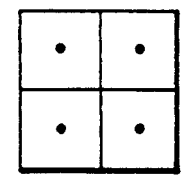

Thus the address of the top left dot (k=1, l=1) in the grain shapes of FIGS. 4A, 4B and 4C becomes the basic address plus the displacement address.

Figure 6:
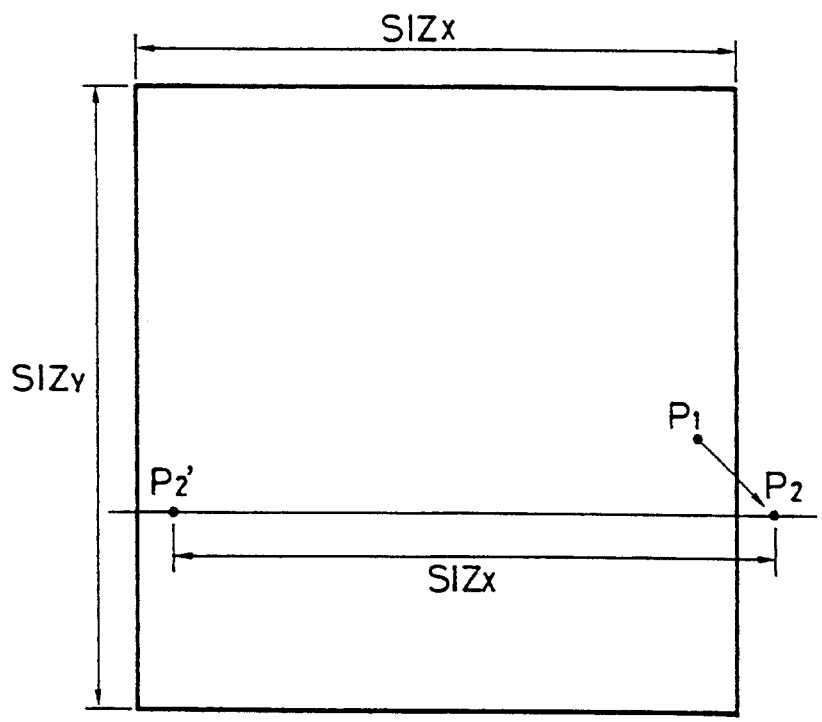
FIG. 6 is a view for explaining how a pixel that has protruded out of its allowed area is to be corrected according to the invention.

After the address of each pixel is calculated in step S6, the grain pattern generator 10 goes to step S7. In step S7, the grain pattern generator 10 corrects the location of a pixel that has protruded out of its allowed image size as follows: Suppose for descriptive purposes that the grain shape of FIG. 4A is used. A pixel whose basic address was within the designated image size (at $P_1$ in FIG. 6) can protrude out of the image size (i.e., at $P_2$) as a result of adding a displacement address to the basic address. In that case, one option would be to ignore the pixel that protruded. With this embodiment, however, the protruding pixel is transferred to a location indicated $P_2'$ in FIG. 6, i.e., opposite to the protruding side. That is, the address of the protruding pixel is corrected so as to keep the pixel within its allowed image size. Although the example of FIG. 6 shows the pixel protruding in the X direction, the same scheme applies to cases where pixels protrude in the Y direction. This simply means that the address of the pixel is counted continuously for movement from one end of the image size to the other in the traverse or longitudinal direction. This makes it possible to generate an endless sand grain pattern.

The grain pattern generator 10 checks to see if the coordinates X (x, l) and Y (k, l) of each pixel obtained in step S6 fall within the designated image size. If the pixel is found to protrude out of its image size, its address is corrected by resorting to one of the following measures:

(1) When X (k, l) < 1, i.e., when the address in the traverse direction protrudes to the left-hand side of the image size of FIG. 5, the corrective address is generated as follows:

$$X(k, l)' = X(k, l) + SIZ_X \qquad (9)$$

(2) When $X(k, l) > SIZ_X$, i.e., when the address in the traverse direction protrudes to the right-hand side of the image size of FIG. 5, the corrective address is generated as follows:

$$X(k, l)' = X(k, l) - SIZ_X \qquad (10)$$

(3) When $Y(k, l) < 1$, i.e., when the address in the longitudinal direction protrudes to the top side of the image size of FIG. 5, the corrective address is generated as follows:

$$Y(k, l)' = Y(k, l) + SIZ_Y \qquad (11)$$

(4) When $Y(k, l) > SIZ_Y$, i.e., when the address in the longitudinal direction protrudes to the bottom side of the image size of FIG. 5, the corrective address is generated as follows:

$$Y(k, l)' = Y(k, l) - SIZ_Y \qquad (12)$$

After the addresses of all pixels have been calculated in the above manner, the grain pattern generator 10 goes to step S8. In step S8, the grain pattern generator 10 writes single or multiple $FF_H$ (H stands for hexadecimal) values around the address location in the display area 11, in order to constitute the grain shape at that location. The writing to the memory continues until the generation of a single pattern is ended in step S9. The pattern written to the display area 11 is transferred to the video RAM of the display processing means 6. From the video RAM, the generated grain pattern is displayed onto the color monitor 7.

If the result of visual checks of the display on the color monitor 7 is satisfactory, step S10' is reached. In step S10, simple proofing preparatory to proof sheet printing is carried out.

For simple proofing of the grain pattern, the size of the display area 11 is too small. Instead, the image size is set illustratively for 3720 pixels by 3720 pixels covering the entire work area. With the other conditions kept the same, steps S4 through S8 may be repeated while the longitudinal and traverse grain counts are changed so as to attain the same grain density as in the previously obtained grain pattern. The color printer 4 is used to output hard copy of the grain pattern. Where the pixel resolution is 8 pixels/mm and where the pattern generated in the work area is output as hard copy, a pattern area of 465 mm by 465 mm may be subjected to simple proofing. If the pattern written in the work area is repeated a predetermined number of times (e.g., 3 times) in both the longitudinal and the traverse directions, the resulting hard copy output on the color printer 4 permits simple proofing in the same size as that of the running-on version. This affords checkups on unintended repetitive patterns in the generated grain pattern.

If the result of the simple proofing is satisfactory, step S10 is reached. In step S10, the proof version generator 8 outputs the obtained pattern in its original size or trims it to a desired size before putting the pattern through the output scanner 5 onto a film. The film thus acquired is used to create a gravure proof plate which in turn is employed by a proof sheet printing machine for proof sheet printing.

If the proofing indicates that the desired grain pattern is not created, step S2 is reached again in which the work area of the memory means 3 and the random number generator are initialized for another round of grain pattern generation.

If the result of the proofing turns out to be satisfactory, step S11' is reached. In step S11', the running version generator 9 repeats the pattern in the work area a predetermined number of times (e.g., 3 times) in both the longitudinal and the traverse directions.

The resulting pattern is output via the output scanner 5 onto a film. The film thus prepared is used to create a gravure running version which in turn is printed for running version proofing. If the running version proofing turns up no problems including unintended repetitive patterns, step S11 is reached. In step S11, the gravure running version is set on a webfed rotary gravure press for running-on operation.

Figure 3:
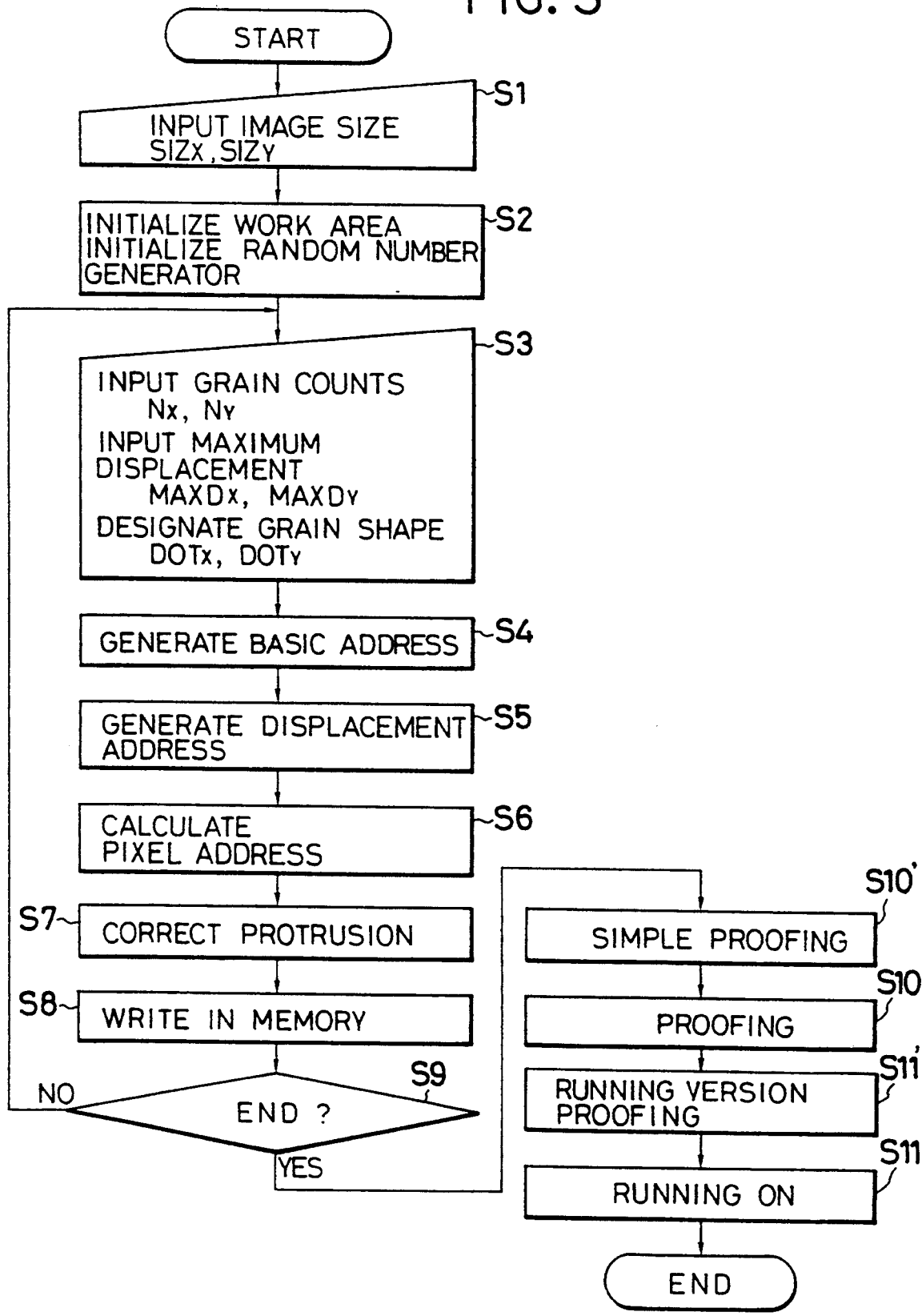
FIG. 3 is a flowchart of steps from pattern generation up to printing of a finished-sand grain pattern.

The processing above applies where step S9 of FIG. 3 marks the end of generating a single grain pattern. In another case, step S9 is followed by step S3. In this case, the grain counts, maximum displacement amounts and grain shape are changed in step S3 followed by steps S4 through S7. In step S8, the grain pattern created this time may be superimposed on the previously written pattern to form a multiple grain pattern design.

The embodiment described above is not limitative of the invention but may be modified into various forms. For example, instead of the dot combination that constitutes the grain shape of the above-described embodiment, patterns of other shapes than dots may be used. The dots may be halftone images instead of binary images. With the above embodiment, the control means 1 comprises the proof version generator and running version generator. Alternatively, the grain pattern data generated by the abstract pattern plate making system according to the invention may be recorded on a floppy disk, magnetic tape or other suitable recording medium. The grain pattern data thus recorded on the medium may be fed to appropriate equipment separate from the inventive system, the equipment generating proof and running versions based on the data.

Furthermore, the above-described embodiment generates the grain pattern using the display area, i.e., part of the work area. Alternatively, the grain pattern may be created using the whole work area from the outset. In this case, the screen of the color monitor may be scrolled for the operator to observe the pattern as a whole.

As many apparently different embodiments of this invention may be made without departing from the spirit and scope thereof, it is to be understood that the invention is not limited to the specific embodiments thereof except as defined in the appended claims.

What is claimed is:

1. An abstract pattern plate making system comprising:
    pattern generating means for assigning a predetermined number of points in a predetermined memory space in such a manner that said points occur at equal and uniform intervals and that the number of points per unit area remains constant;
    displacing means for randomly displacing the address of each of said points within a predetermined maximum range of displacement, a displaced address of each point being determined by generating a random number for each point and multiplying the random number by the predetermined maximum range of displacement;

means for allocating a predetermined grain pattern to the displaced address of each of said points to generate an abstract pattern by replacing each of said points with a predetermined grain pattern having at least one pixel, and by determining an address of each pixel of the predetermined grain pattern based on the predetermined grain pattern and the displaced address of each point;

means for shifting an address of a pixel protruding outside of a side of the predetermined memory space to a location that is within the predetermined memory space and opposite to the protruding side; and duplicating means for duplicating the generated abstract pattern in longitudinal and traverse directions a predetermined number of times to generate a final pattern.

2. Printed matter printed with a plate created by executing the steps of:

assigning a predetermined number of points in a predetermined memory space in such a manner that said points occur at equal and uniform intervals and that the number of points per unit area remains constant;

randomly displacing the address of each of said points within a predetermined maximum range of displacement, a displaced address of each point being determined by generating a random number for each point and multiplying the random number by the predetermined maximum range of displacement;

allocating a predetermined grain pattern to the displaced address of each of said points to generate an abstract pattern by replacing each of said points with the predetermined grain pattern having at least one pixel and determining an address of each pixel of the predetermined grain pattern based on the predetermined grain pattern and the displaced address of each point;

shifting an address of a pixel protruding outside of a side of the predetermined memory space to a location within the predetermined memory space and opposite to the protruding side;

duplicating the generated abstract pattern in longitudinal and traverse directions a predetermined number of times to generate a final pattern; and creating said plate based on said final pattern.

3. Printed matter according to claim 2, wherein the printing of said plate is gravure printing.

4. Printed matter according to claim 3, wherein said predetermined pattern is constituted by at least one dot.

* * * * *